(12) United States Patent
Tu

(10) Patent No.: US 7,029,968 B2
(45) Date of Patent: Apr. 18, 2006

(54) METHOD OF FORMING A PIP CAPACITOR

(75) Inventor: Kuo-Chi Tu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/729,084

(22) Filed: Dec. 5, 2003

(65) Prior Publication Data

US 2005/0124133 A1 Jun. 9, 2005

(51) Int. Cl.
*H01L 21/8242* (2006.01)

(52) U.S. Cl. ............... 438/210; 438/201; 438/211; 438/239; 438/253; 438/257; 438/264; 438/396

(58) Field of Classification Search ........... 438/201, 438/210, 211, 239, 241, 253, 257, 264, 396, 438/593, FOR. 203, FOR. 220, FOR. 430
See application file for complete search history.

(56) References Cited

U.S. PATENT DOCUMENTS

| | | | |
|---|---|---|---|
| 4,855,952 A | | 8/1989 | Kiyosumi |
| 5,814,850 A | * | 9/1998 | Iwasa ................. 257/296 |
| 6,277,686 B1 | * | 8/2001 | Yeh et al. ............ 438/241 |
| 6,492,224 B1 | | 12/2002 | Jao |
| 6,716,694 B1 | * | 4/2004 | Yamada ............... 438/239 |
| 6,784,054 B1 | * | 8/2004 | Nitta et al. .......... 438/257 |
| 2001/0026973 A1 | * | 10/2001 | Yeh et al. ........... 438/239 |
| 2002/0061619 A1 | * | 5/2002 | Yamada .............. 438/239 |
| 2002/0070402 A1 | * | 6/2002 | Ichige et al. ........ 257/296 |

OTHER PUBLICATIONS

EMOSYN, "Technology—Flash", Emosyn Technology; Flash & Ferroelectrics, http://www.emosyn.com/dspPage.asp?pagid=24.

* cited by examiner

*Primary Examiner*—George Fourson
*Assistant Examiner*—Joannie Adelle Garcia
(74) *Attorney, Agent, or Firm*—Slater & Matsil, L.L.P.

(57) ABSTRACT

A method of forming a polysilicon-insulator-polysilicon (PIP) capacitor in a mixed mode semiconductor device. A floating gate of a split gate transistor and a bottom electrode of a PIP capacitor are formed from a first polysilicon layer using a single lithography mask. Poly-oxide regions are formed over the floating gate and the bottom electrode, and an oxide layer is formed over the poly-oxide regions and other exposed material layers. A nitride layer is deposited over the oxide layer. The nitride layer is patterned to expose at least a portion of the poly-oxide region over the bottom electrode. The exposed oxide layer and poly-oxide region are removed from over the bottom electrode. A second polysilicon layer is deposited over the structure, and a control gate of the split gate transistor and a top electrode of the PIP capacitor are formed from the second polysilicon layer using a single lithography mask.

29 Claims, 7 Drawing Sheets

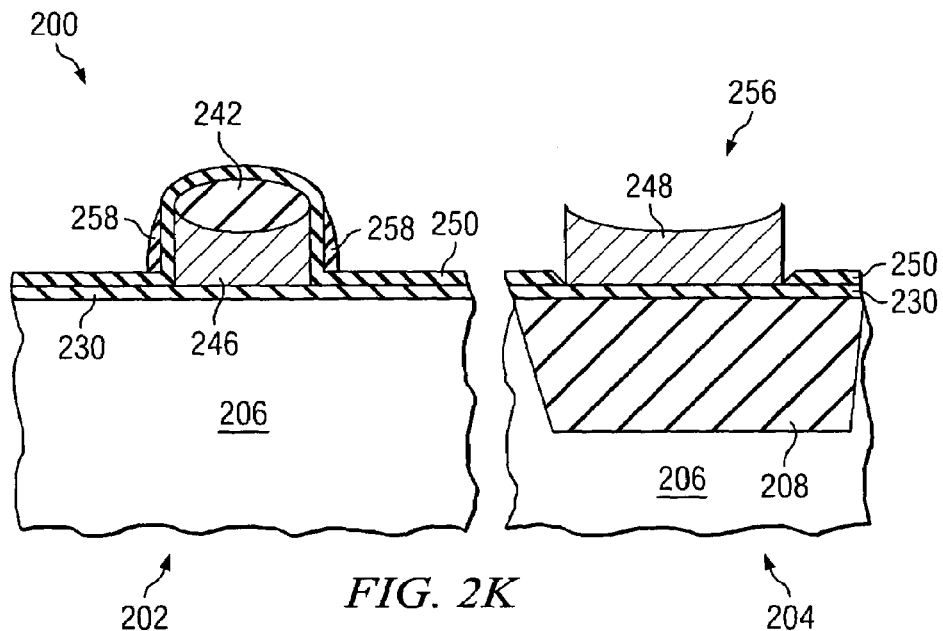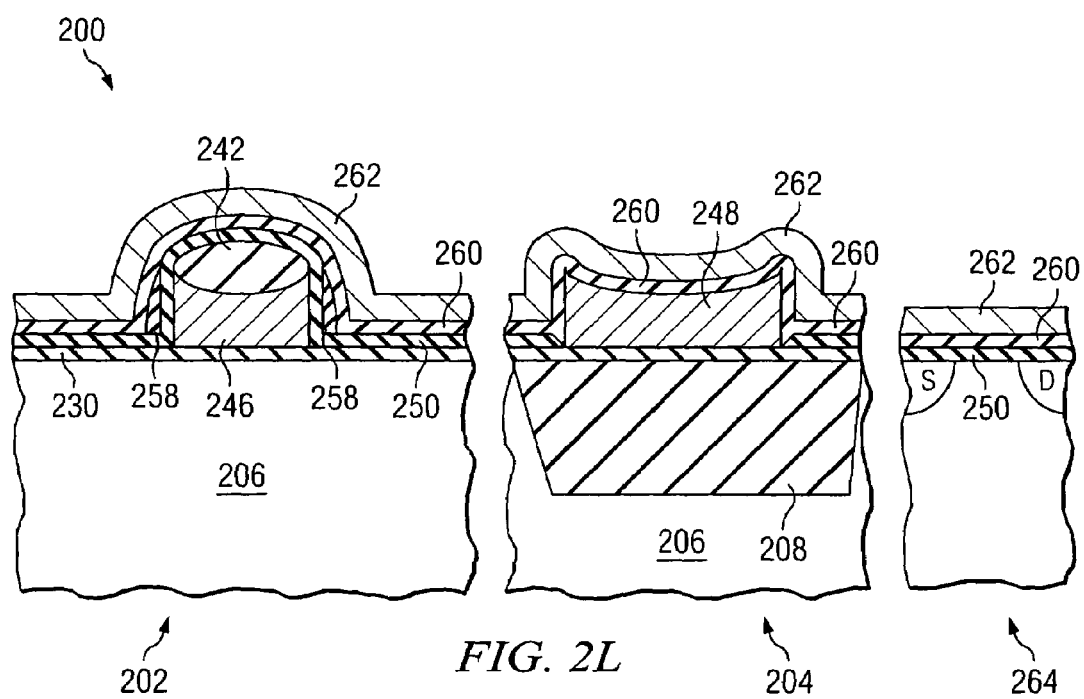

METHOD OF FORMING A PIP CAPACITOR

TECHNICAL FIELD

The present invention relates generally to the manufacturing of semiconductor devices, and more particularly to a method of forming a polysilicon-insulator-polysilicon (PIP) capacitor for mixed-mode semiconductor device processing.

BACKGROUND

Capacitors are elements that are used extensively in semiconductor devices for storing an electrical charge. Capacitors essentially comprise two conductive electrodes separated by an insulator. The capacitance, or amount of charge held by the capacitor per applied voltage, depends on a number of parameters such as the area of the electrodes, the distance between the electrodes, and the dielectric constant value for the insulator between the electrodes, as examples.

It is common for capacitors, as well as resistors, transistors, diodes, and other circuit elements, to be formed in semiconductor integrated circuits (IC's) of various types. Capacitors formed within analog integrated circuit fabrications typically assure proper operation of those analog integrated circuits, for example. Capacitors formed within digital integrated circuits typically provide storage locations for individual bits of digital data. Capacitors are used in filters, analog-to-digital converters, memory devices, control applications, and many other types of semiconductor devices.

One type of capacitor is a PIP capacitor, which is frequently used in mixed-mode devices and logic devices, as examples. PIP capacitors are used to store a charge in a variety of semiconductor devices. PIP capacitors are often used as a storage node in a memory device, for example. A PIP capacitor is typically formed horizontally on a semiconductor wafer, with two polysilicon electrodes sandwiching a dielectric layer parallel to the wafer surface.

A PIP capacitor formed within an integrated circuit usually comprises a double layer polysilicon capacitor. Double layer polysilicon capacitors are formed from two substantially planar conductive polysilicon electrodes separated by a dielectric layer. Double layer polysilicon capacitors provide several advantages when used within integrated circuits. For example, double layer polysilicon capacitors may easily be formed within several locations within an IC.

Performance enhancements may also make blending logic and memory on the same IC attractive for particular applications. In electronic systems in which logic and memory are packaged separately, data signals between the two may have to pass through several layers of packaging (i.e. through the original IC chip to external pins, then through the card and/or board wiring, and finally into the receiving IC chip, including its internal wiring), all of which cause undesirable propagation delays. As device sensitivities increase and device size decreases, transistor switching speeds no longer limit the logic delay or access time of the IC. Rather, the time required for the device to charge capacitive loads becomes the limiting factor for IC performance. The capacitive load is partially dependent on the length of lines interconnecting devices, thus minimizing these connection lengths, such as through combining logic and memory on the same IC, will enhance performance.

It is also desirable to integrate passive components such as capacitors with the logic and memory (active components) on the same IC, referred to in the art as mixed-mode devices. As described above, capacitors are a basic building block in many electronic circuits, and may be used for analog applications such as switched capacitor filters, for example. Traditionally, formation of a capacitor requires two separate lithography masks: a first mask for the bottom electrode and a second mask for the top electrode. Lithography masks are expensive and are thus a significant cost factor in IC fabrication.

Therefore, there are trends in the semiconductor manufacturing industry to develop methods of minimizing the number of lithography masks used, and also to develop methods of integrating mixed-mode capacitors with memory cells, such as split gate flash transistor processes.

U.S. Pat. No. 6,277,686 issued to Yeh et al. on Aug. 21, 2001, which is hereby incorporated herein by reference, describes a method of forming a mixed mode process PIP capacitor for split gate flash devices. Yeh et al. recognize that it is undesirable for a PIP capacitor to have a thick poly-oxide layer formed over the first or bottom electrode because the thick poly-oxide layer causes the unit capacitance of the PIP capacitor to be low. In this patent, Yeh et al. teach a processing method wherein a first mask is used to pattern a first polysilicon layer to form a floating gate of a split gate flash memory device, and a second mask is used to pattern the first polysilicon layer to form a PIP capacitor bottom electrode. This manufacturing method is costly because two lithography masks are required to pattern the first polysilicon layer.

SUMMARY OF THE INVENTION

These and other problems are generally solved or circumvented, and technical advantages are generally achieved, by preferred embodiments of the present invention, which provide methods of forming PIP capacitors that do not have a thick poly-oxide layer as a capacitor dielectric. The methods use only one mask to pattern a first polysilicon layer to form floating gates in a transistor region and PIP capacitor bottom electrodes in a capacitor region. A double layer polysilicon capacitor in a split gate flash memory cell is disclosed, wherein a double layer polysilicon capacitor is formed simultaneously with the forming of a split gate flash memory cell. The transistor gate oxide is used as the insulator between the bottom and top electrodes of the capacitor. A PIP capacitor is achieved that is fully compatible with split gate flash memory cell fabrication methods and processes.

In accordance with a preferred embodiment of the present invention, a method of forming a capacitor includes providing a workpiece, the workpiece including at least one capacitor region and at least one transistor region, and depositing a first semiconductor layer over the workpiece. A hard mask layer is formed over the first semiconductor layer, and the hard mask layer is patterned with a pattern for at least one bottom electrode in the at least one capacitor region and a pattern for at least one floating gate in the at least one transistor region. A first poly-oxide region is formed over the pattern for each at least one floating gate, and a second poly-oxide region is formed over the pattern for each at least one bottom electrode, the first poly-oxide region having a top surface and the second poly-oxide region having a top surface. The hard mask layer is removed, leaving portions of the first semiconductor layer exposed, and the exposed portions of the first semiconductor layer are removed to form at least one floating gate in the at least one transistor region and at least one bottom electrode in the at least one capacitor region, the at least one floating gate comprising sidewalls and the at least one bottom electrode comprising sidewalls. A first oxide layer is formed over the top surface of the first poly-oxide region, the top surface of the second poly-oxide region, the sidewalls of the at least one bottom electrode, the sidewalls of the at least one floating gate, and the first oxide layer. The first oxide layer and the second poly-oxide region are removed in the at least one capacitor region, and a second oxide layer is formed over at least the at least one capacitor bottom electrode in the capacitor region. A second semiconductor layer is deposited over the second oxide layer, and portions of the second semiconductor layer are removed to form a control gate proximate each at least one floating gate in the at least one transistor region and a top electrode over each bottom electrode in the at least one capacitor region.

In accordance with another preferred embodiment of the present invention, a method of forming a PIP capacitor includes providing a workpiece, the workpiece including at least one capacitor region and at least one transistor region, forming a first oxide layer over the workpiece, depositing a first polysilicon layer over the first oxide layer, and forming a mask layer over the first polysilicon layer. The mask layer comprises a pattern for at least one bottom electrode in the at least one capacitor region and a pattern for at least one floating gate in the at least one transistor region. A first poly-oxide region is formed over the pattern for each at least one floating gate, and a second poly-oxide region is formed over the pattern for each at least one bottom electrode, the first poly-oxide region having a top surface and the second poly-oxide region having a top surface. The method includes removing the first nitride layer, leaving portions of the first polysilicon layer exposed, and using the first poly-oxide region and the second poly-oxide region as a mask to remove the exposed portions of the first polysilicon layer and form at least one floating gate in the at least one transistor region and at least one bottom electrode in the at least one capacitor region, the at least one floating gate comprising sidewalls and the at least one bottom electrode comprising sidewalls. A second oxide layer is formed over the top surface of the first poly-oxide region, the top surface of the second poly-oxide region, the sidewalls of the at least one bottom electrode, the sidewalls of the at least one floating gate, and the first oxide layer, and a second nitride layer is deposited over the second oxide layer. The method includes removing a portion of the second nitride layer to expose at least a portion of the second poly-oxide region over the bottom electrode in the capacitor region, removing the second oxide layer and the second poly-oxide region from over a top surface of the bottom electrode in the at least one capacitor region, and removing at least portions of the second nitride layer, leaving a spacer comprising the second nitride layer on the sidewalls of the at least one floating gate. A third oxide layer is formed over at least the at least one capacitor bottom electrode in the capacitor region, a second polysilicon layer is deposited over the third oxide layer, a second photoresist layer is deposited over the second polysilicon layer, and the second photoresist layer is patterned. The second photoresist layer is used to pattern the second polysilicon layer, forming a control gate proximate each at least one floating gate in the at least one transistor region, and forming a top electrode over each bottom electrode in the at least one capacitor region, wherein the bottom electrode, the top electrode, and the third oxide layer disposed between the bottom electrode and top electrode comprise a PIP capacitor.

In accordance with another preferred embodiment of the present invention, a semiconductor device includes a workpiece, the workpiece including at least one capacitor region and at least one transistor region, a first oxide layer formed over the workpiece, and a floating gate disposed over the first oxide layer in the at least one transistor region, the floating gate comprising sidewalls. A bottom electrode is disposed over the first oxide layer in the at least one capacitor region, the floating gate and bottom electrode being formed from a first semiconductor layer. A poly-oxide region is disposed over the floating gate, the poly-oxide region having a top surface. A second oxide layer is disposed over the top surface of the poly-oxide region and the sidewalls of the at least one floating gate in the at least one transistor region. A third oxide layer is disposed over the bottom electrode in the at least one capacitor region and over the first oxide layer in the at least one transistor region. A control gate is proximate the floating gate in the at least one transistor region, and a top electrode is disposed over each bottom electrode in the at least one capacitor region, the control gate and the top electrode being formed from a second semiconductor layer.

Advantages of embodiments of the invention include providing a method of forming a PIP capacitor in a mixed mode semiconductor device that is compatible with manufacturing processes for split gate transistor devices such as flash memory cells. The number of lithography masks and processing steps is reduced, resulting in a cost and time savings. A nitride layer that is used as a hard mask to remove poly-oxide and other oxide layers from over the PIP capacitor bottom electrode may form a nitride spacer on sidewalls of the floating gate of the split gate transistor device, preventing reverse tunneling of the split gate transistor device.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2A–2H, and 2J–2M show cross-sectional views of a method of fabricating a mixed-mode semiconductor device comprising split gate transistors in a transistor region and PIP capacitors in a capacitor region, in accordance with an embodiment of the present invention.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a split gate transistor of a flash memory device. The invention may also be applied, however, to PIP capacitors formed proximate other semiconductor devices. Although only one split gate transistor is shown in the transistor region of the figures, there may be a plurality of split gate transistors formed in the transistor region or regions of the semiconductor devices shown. Likewise, although only one PIP capacitor is shown in the capacitor region in the figures, there may be a plurality of PIP capacitors formed in the capacitor region or regions of the semiconductor devices shown.

Figure 1:
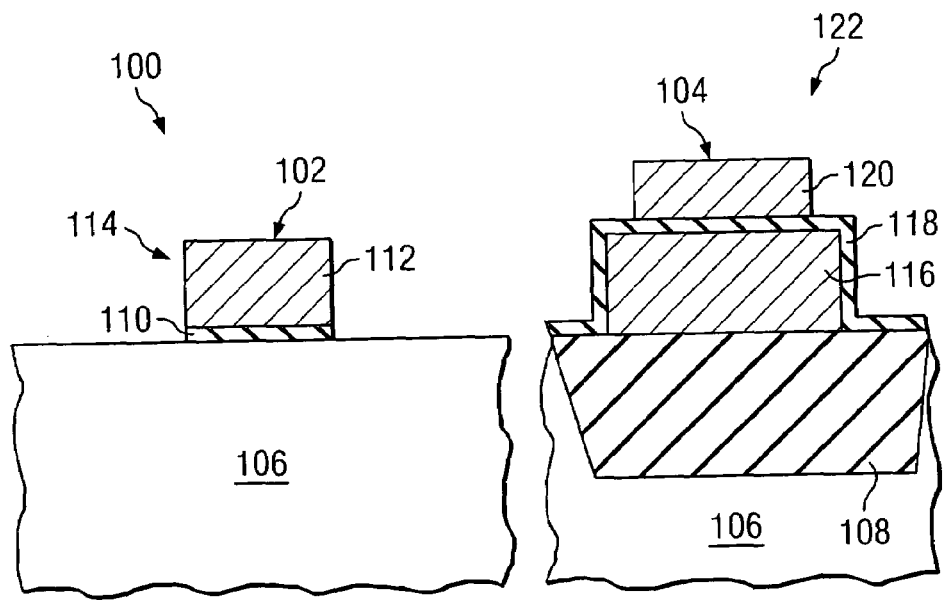
FIG. 1 shows a cross-sectional view of a prior art mixed mode PIP capacitor.

FIG. 1 shows a cross-sectional view of a prior art mixed mode PIP capacitor integrated in the manufacturing of a logic semiconductor device. The semiconductor device 100 includes gate regions 102 and capacitor regions 104. There may be one or more transistor region 102 and capacitor region 104 on the semiconductor device 100, for example. The semiconductor device 100 comprises a workpiece 106 that may be a semiconductor substrate, for example. Shallow trench isolation (STI) regions 108 may be formed in portions of the workpiece 106, as shown in the capacitor region 104. The STI regions 108 typically isolate various circuit elements of the semiconductor device 100 from one another.

The semiconductor device 100 includes a transistor gate 114 comprising a gate material 112, formed over a gate oxide 110 in the transistor region 102. Other material layers are deposited and patterned to form a flash memory cell (not shown) over the transistor gate 114 which may be a floating gate, for example. In the capacitor region 104, a PIP capacitor 122 is shown comprising a bottom plate or electrode 116, a capacitor dielectric 118 formed over the bottom electrode 116, and a top electrode 120 formed over the capacitor dielectric 118.

A problem with the prior art structure shown in FIG. 1 is that many lithography masks are required to pattern the various material layers shown. For example, there may be eight to twelve lithography masks (not shown) required to pattern the various material layers of the semiconductor device 100.

Embodiments of the present invention achieve technical advantages by decreasing the number of lithography masks required for manufacturing mixed-mode PIP capacitors. A preferred embodiment of the present invention will next be described with reference to FIGS. 2A through 2H and 2J through 2M, which show a semiconductor device 200 at various stages of manufacturing in accordance with an embodiment of the present invention.

Figure 2A:
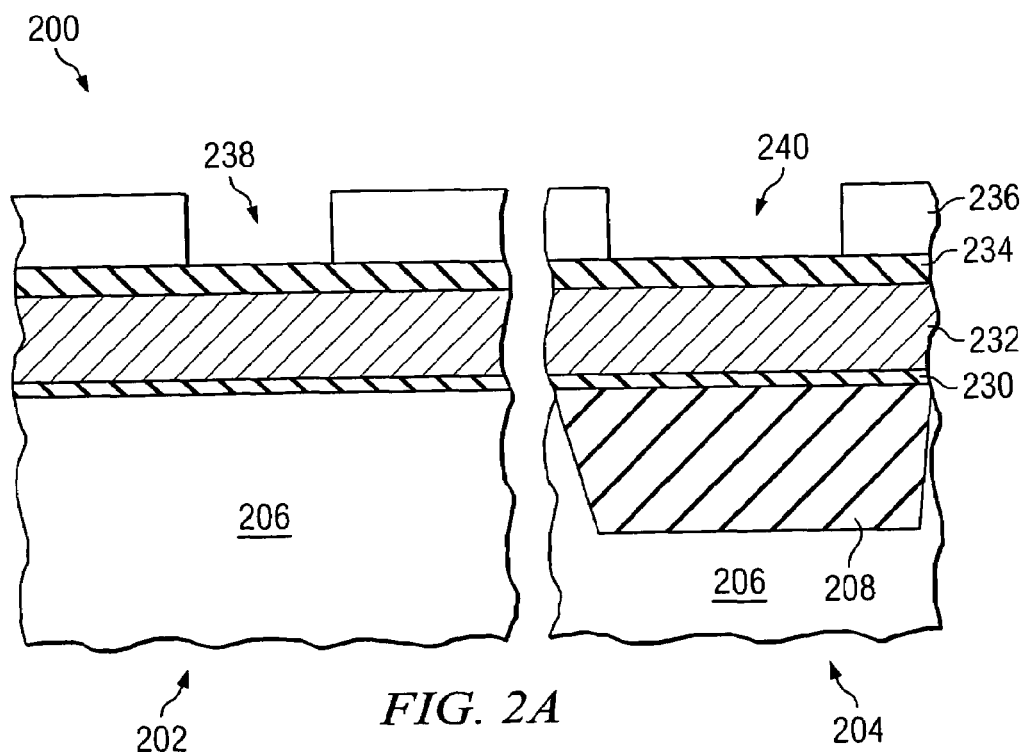

Referring first to FIG. 2A, therein is shown a semiconductor device 200 that includes a workpiece 206. The workpiece 206 may include a semiconductor substrate comprising silicon or other semiconductor materials covered by an insulating layer, for example. The workpiece 206 may also include other active components or circuits, not shown. The workpiece 206 may comprise silicon oxide over single-crystal silicon, for example. The workpiece 206 may include other conductive layers or other semiconductor elements, e.g. transistors, diodes, etc. Compound semiconductors, GaAs, InP, Si/Ge, or SiC, as examples, may be used in place of silicon.

The semiconductor device 200 includes at least one transistor region 202 and at least one capacitor region 204. STI regions 208 may be formed within portions of the workpiece 206, e.g., in capacitor region 204, as shown. STI regions 208 may also be formed in other portions of the workpiece 206, not shown.

In accordance with a preferred embodiment of the present invention, a first oxide layer 230 is deposited or formed over the workpiece 206 and/or STI regions 208. The first oxide layer 230 preferably is formed using a thermal oxidation process, and preferably comprises a thickness of about 50 to 200 Å of silicon dioxide, for example. The first oxide layer 230 is preferably relatively thin so that it may function as a tunnel oxide in transistor region 202, for example. The first oxide layer 230 may alternatively comprise other oxide materials, other thicknesses, and may be deposited or formed by other methods, for example.

A first semiconductor material layer 232 is deposited over the first oxide layer 230. The first semiconductor material layer 232 preferably comprises polysilicon deposited in a thickness of about 500 to 3000 Å, as examples, and more preferably, comprises a thickness of about 1200 Å, in one embodiment. The first semiconductor material layer 232 may alternatively comprise other semiconductor materials deposited in other thicknesses, for example. The first semiconductor material layer 232 will function as a floating gate material in the transistor region 202 and a bottom electrode in the capacitor region 204, to be described further herein. The first semiconductor material layer 232 may be doped by ion implantation, for example.

A hard mask layer 234 is deposited over the first semiconductor material layer 232. The hard mask layer 234 is also referred to herein as a first nitride layer 234 and preferably comprises about 300 to 1800 Å of a nitride material, as examples. The hard mask layer 234 more preferably comprises about 800 Å of $Si_3N_4$ in one embodiment, for example. The hard mask layer 234 alternatively may comprise other materials adapted to be used to form regions of poly-oxide over the first semiconductor material layer 232, e.g., materials that are not oxidized substantially by chemistries used to form poly-oxide over the first semiconductor material layer 232. The first nitride layer 234 is preferably deposited using low-pressure chemical vapor deposition (LPCVD). Alternatively, the first nitride layer 234 may be deposited using plasma-enhanced chemical vapor deposition (PECVD) or other deposition methods, as examples.

A first photoresist layer 236 is deposited over the first nitride layer 234. The first photoresist layer 236 is patterned using lithography with a pattern 238 for a floating gate of a transistor in the transistor region 202 and a pattern 240 for a capacitor bottom electrode or plate in the capacitor region 204. Preferably, in accordance with embodiments of the present invention, a single photoresist layer 236 is used to pattern both the floating gate of transistor in the transistor region 202 and a first or bottom electrode of a capacitor in the capacitor region 204. This is advantageous because the number of masks required to manufacture the semiconductor device 200 is reduced, resulting in a cost savings and simplification of the manufacturing process, to be described further herein.

Figure 2B:
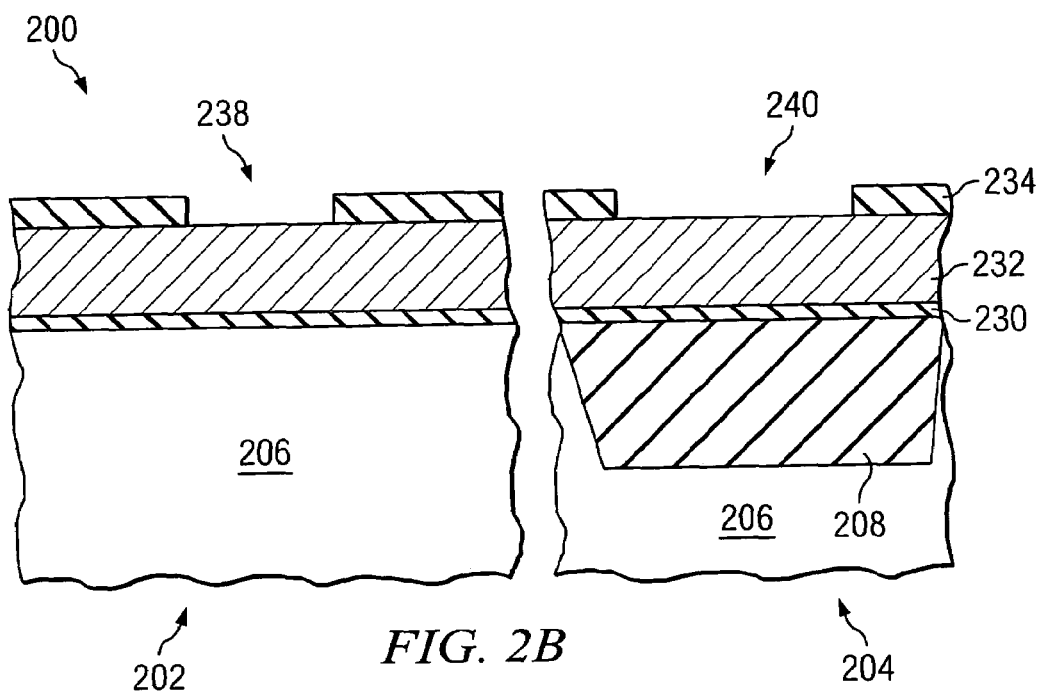

The patterns 238 and 240 are transferred from the photoresist 236 to the first nitride layer 234, as shown in FIG. 2B. This is preferably accomplished using traditional lithography techniques. For example, the photoresist 236 may be used as a mask while the first nitride layer 234 is etched away in exposed portions, namely proximate patterned regions 238 and 240 in the photoresist 236. The etch process that is used to pattern the first nitride layer 234 preferably comprises an etch process that is adapted to stop on the first semiconductor material layer 232, in one embodiment, for example. The first layer of photoresist 236 is then removed, using a photoresist strip process, as an example.

Figure 2C:
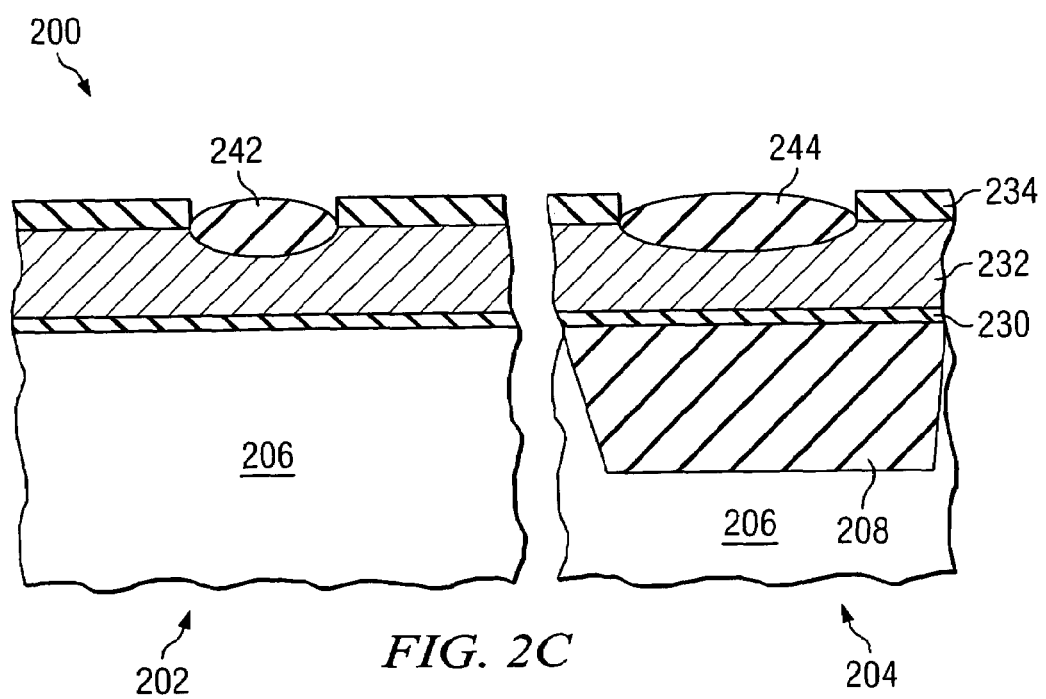

The first nitride layer 234 is used as a mask while poly-oxide layer 242 and 244 are formed in the transistor region 202 and capacitor region 204, respectively, as shown in FIG. 2C. Poly-oxide regions 242 and 244 are preferably formed using wet oxidation, e.g., at about 800° C. to 1000° C., for example. The poly-oxide regions 242 and 244 may alternatively be formed using other oxidation methods, for example. The poly-oxide regions 242 and 244 preferably comprise a thickness of about 800 to 2000 Å, for example. The poly-oxide regions 242 and 244 preferably comprise oxidized semiconductor material such as oxidized polysilicon, for example.

Figure 2D:
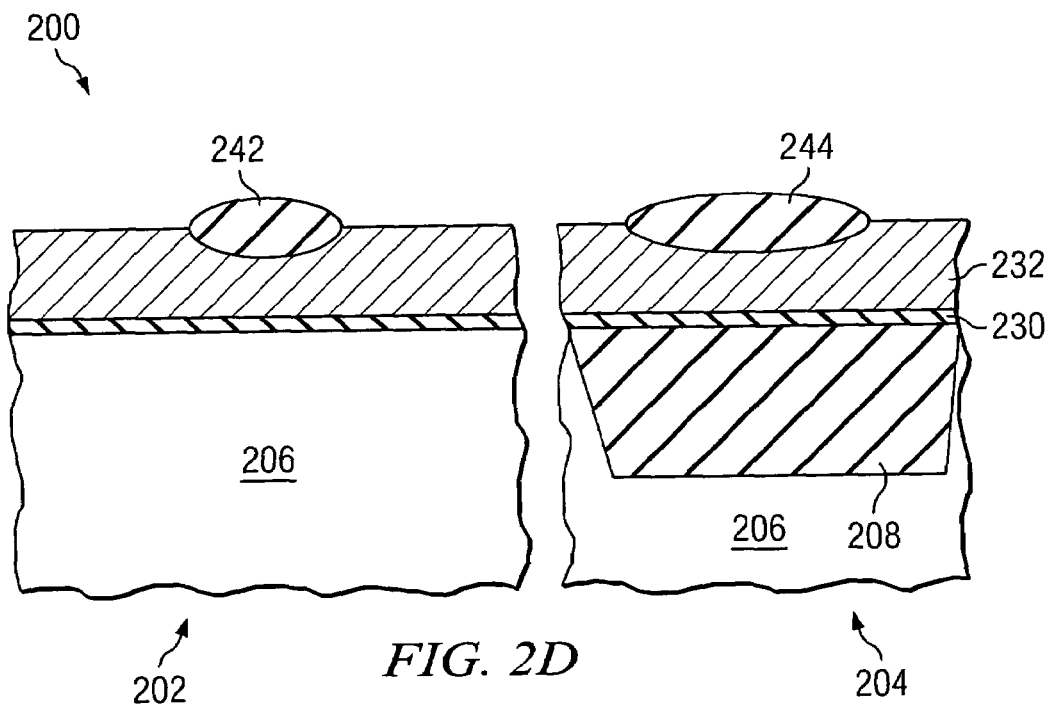
Figure 2E:
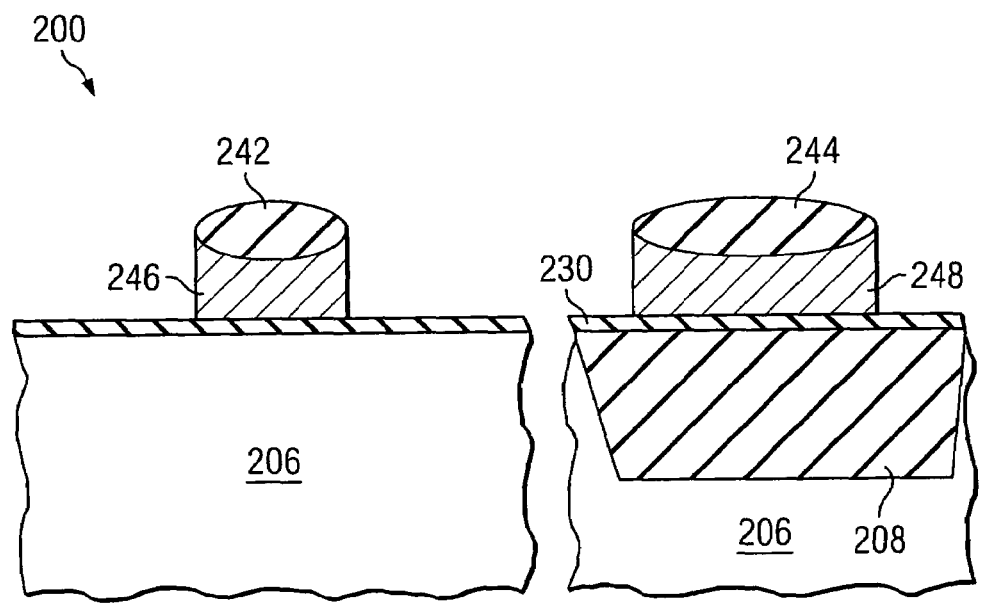

The first nitride layer 234 is then removed, as shown in FIG. 2D. The poly-oxide regions 242 and 244 are used as a mask while exposed portions of the first semiconductor material layer 232 are etched away or removed, as shown in FIG. 2E. The first semiconductor material layer 232 left remaining in the transistor region 202 comprises a floating gate 246, and the first semiconductor material layer 232 left remaining in the capacitor region 204 comprises a first or bottom electrode 248 of a PIP capacitor. The poly-oxide regions 242 and 244 are used as a hard mask while the first semiconductor material layer 232 is etched, for example. Advantageously, in this process step, the floating gate 246 and bottom electrode 248 are simultaneously formed.

Figure 2F:
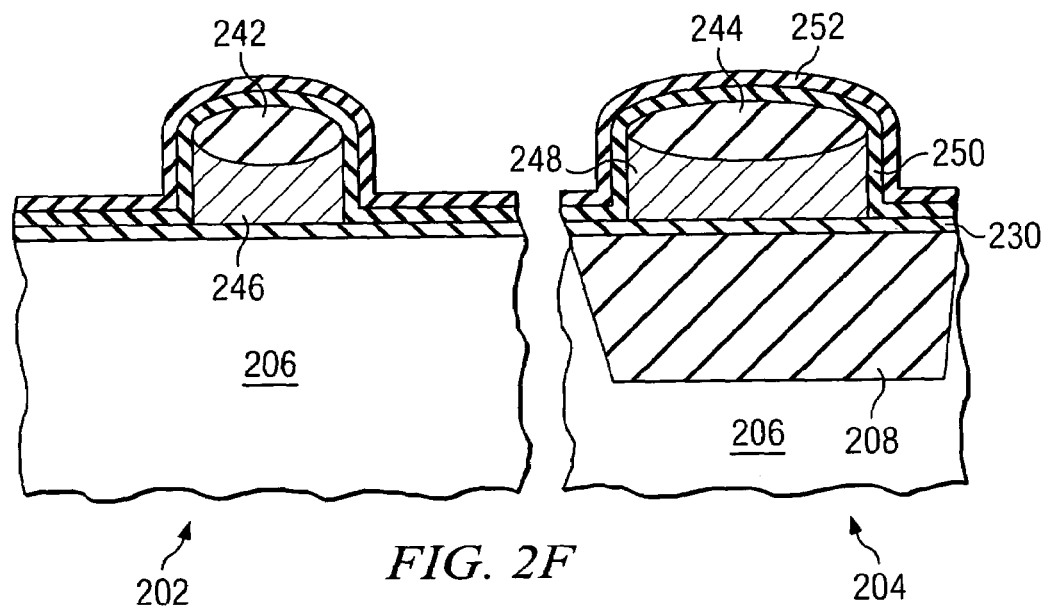

Referring next to FIG. 2F, a second oxide layer 250 is deposited over the top surface of the poly-oxide regions 242 and 244, the sidewalls of the floating gate 246, the sidewalls of the capacitor bottom electrode 248, and exposed portions of the first oxide layer 230. The second oxide layer 250 preferably comprises a thickness of about 100 to 300 Å, for example. The second oxide layer 250 preferably comprises silicon dioxide, although the second oxide layer 250 may alternatively comprise other oxide materials, as examples. The second oxide layer 250 may also be referred to as an inter-poly oxide, for example.

A second nitride layer 252 is deposited over the second oxide layer 250, also shown in FIG. 2F. The second nitride layer 252 preferably comprises a thickness of about 100 to 400 Å, for example. The second nitride layer 252 preferably comprises Si$_3$N$_4$, although the second nitride layer 252 may alternatively comprise other nitride materials, for example. The second nitride layer 252 is preferably deposited by LPCVD, although PECVD or other deposition methods may alternatively be used.

Figure 2G:
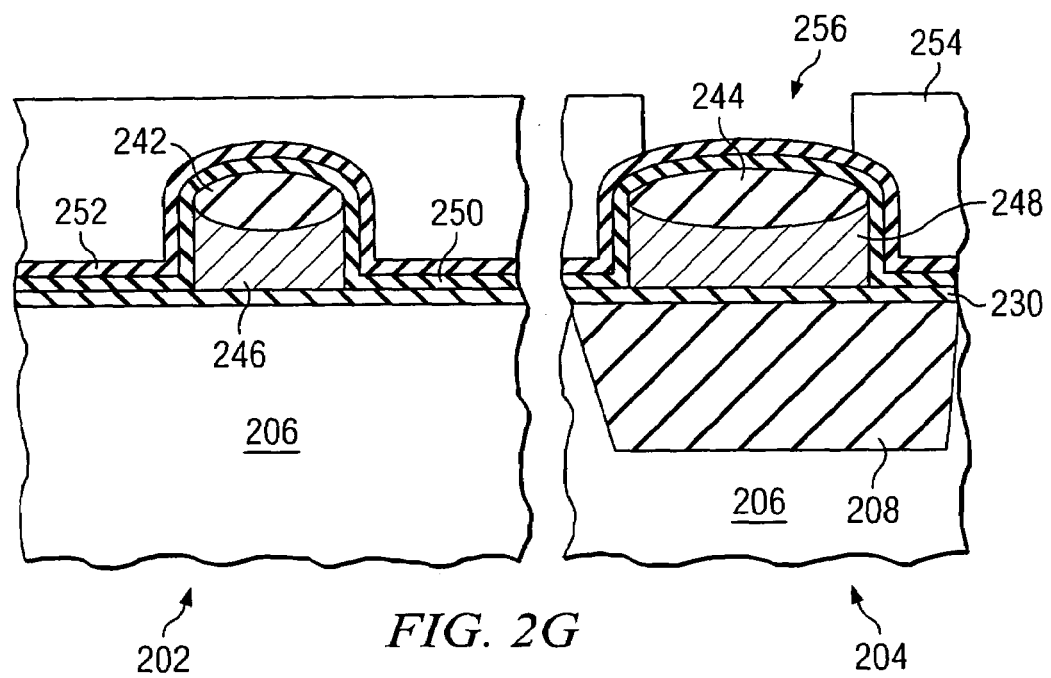

A second photoresist layer 254 is deposited over the second nitride layer 252, as shown in FIG. 2G. The second photoresist layer 254 is preferably deposited in a thickness such that it resides over the top surface of the second nitride layer 252 over the poly-oxide regions 242 and 244, for example. The second photoresist layer 254 is patterned using lithography with a pattern 256. The pattern 256 preferably comprises a width that is adequate to remove the underlying poly-oxide 244 and second oxide layer 250 from the top surface of the bottom electrode 248, to be described further herein. The pattern 256 in one embodiment comprises a width that is adequate to remove the second oxide layer 250 from the sidewalls of the bottom electrode 248, for example.

Figure 2H:
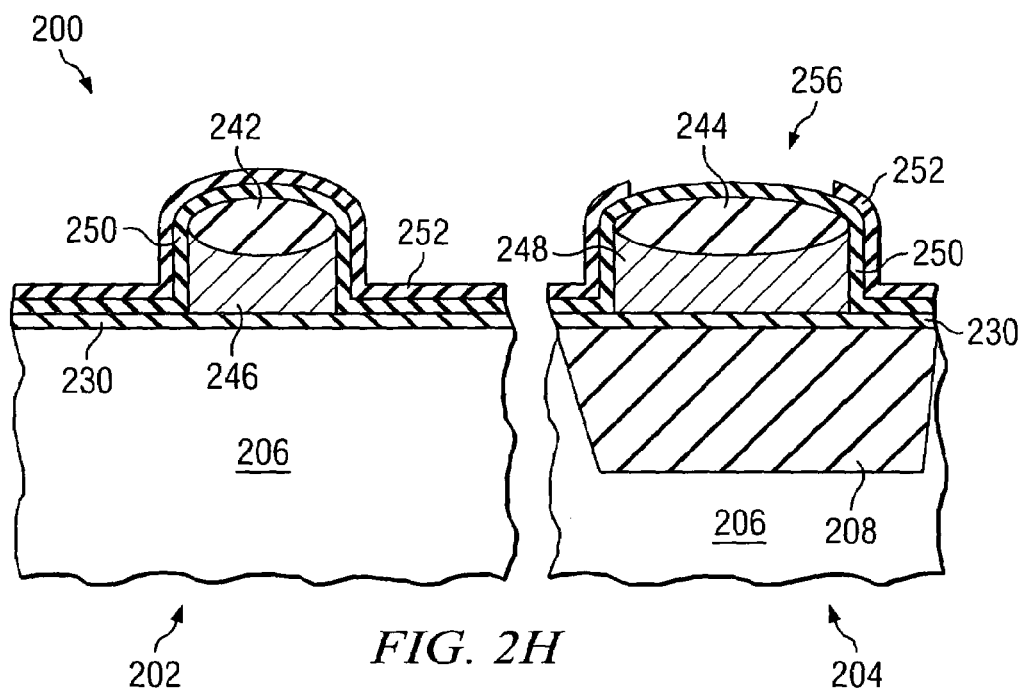

The second photoresist layer 254 is then used as a mask while exposed portions of the second nitride layer 252 are etched away or removed, as shown in FIG. 2H. The second photoresist layer 254 is then removed.

Figure 2J:
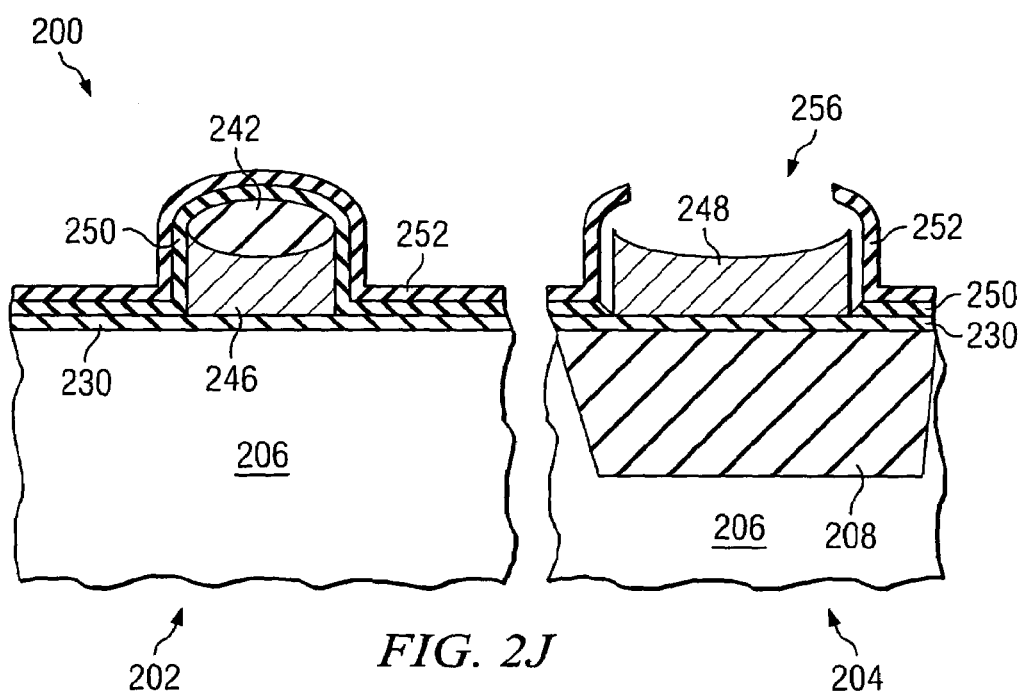

The second nitride layer 252 is then used as a hard mask to etch away or remove exposed portions of the second oxide layer 250 and the poly-oxide region 244 in the capacitor region 204, as shown in FIG. 2J. Preferably the removal of the second oxide layer 250 and the poly-oxide region 244 comprises a wet dip process, in one embodiment. The wet-dip process may comprise a diluted hydrofluoric acid (HF) or a buffered oxide etch (BOE), for example. Alternatively, the removal of the second oxide layer 250 and the poly-oxide region 244 may comprise other methods, for example. The second oxide layer 250 is preferably removed from at least the top surface of the bottom electrode 248. The second oxide layer 250 may also be removed from the sidewalls of the bottom electrode 248, for example, as shown.

At least portions of the second nitride layer 252 are then removed from the top surface of the second oxide layer 250, as shown in FIG. 2K. Preferably, in one embodiment, an anisotropic etch process is used to remove the second nitride layer 252, so that nitride spacers 258 are left remaining on the sidewalls of the second oxide layer 250 proximate the floating gate 246 sidewalls in the transistor region 202. The spacers 258 formed from the second nitride layer 252 are advantageous in that they prevent reverse tunneling of a split-gate transistor that will be formed, to be described further herein.

A third oxide layer 260 is formed over the top surface and sidewalls of the bottom electrode 248, as shown in FIG. 2L. The third oxide layer 260 may be deposited or grown, as examples. The third oxide layer 260 will function as the capacitor dielectric of a capacitor in the capacitor region 204, to be described further herein. The third oxide layer 260 may optionally be formed over the top surface of the second oxide layer 250 and spacers 258 in the transistor region 202, as shown. The third oxide layer 260 preferably comprises a thickness of about 15 to 300 Å, as examples, and more preferably comprises a thickness of about 1000 Å in one embodiment.

The third oxide layer 260 may optionally also be formed over a top surface of the workpiece 206 in a periphery circuit region 264, as shown. The periphery circuit region 264 may have one or more source regions S and drain regions D formed therein. The second oxide layer 250 may optionally also be formed over the source and drain regions S and D in the periphery circuit region 264, for example. The semiconductor device may optionally comprise one or more periphery circuit regions 264.

A second semiconductor material layer 262 is formed over the third oxide layer 260. The second semiconductor material layer 262 preferably comprises polysilicon, although the second semiconductor material layer 262 may alternatively comprise other semiconductor materials, for example. The second semiconductor material layer 262 preferably comprises polysilicon deposited in a thickness of about 500 to 2000 Å, as examples, and more preferably, comprises a thickness of about 1000 Å, in one embodiment. The second semiconductor material layer 262 may be doped by ion implantation, for example.

Figure 2M:
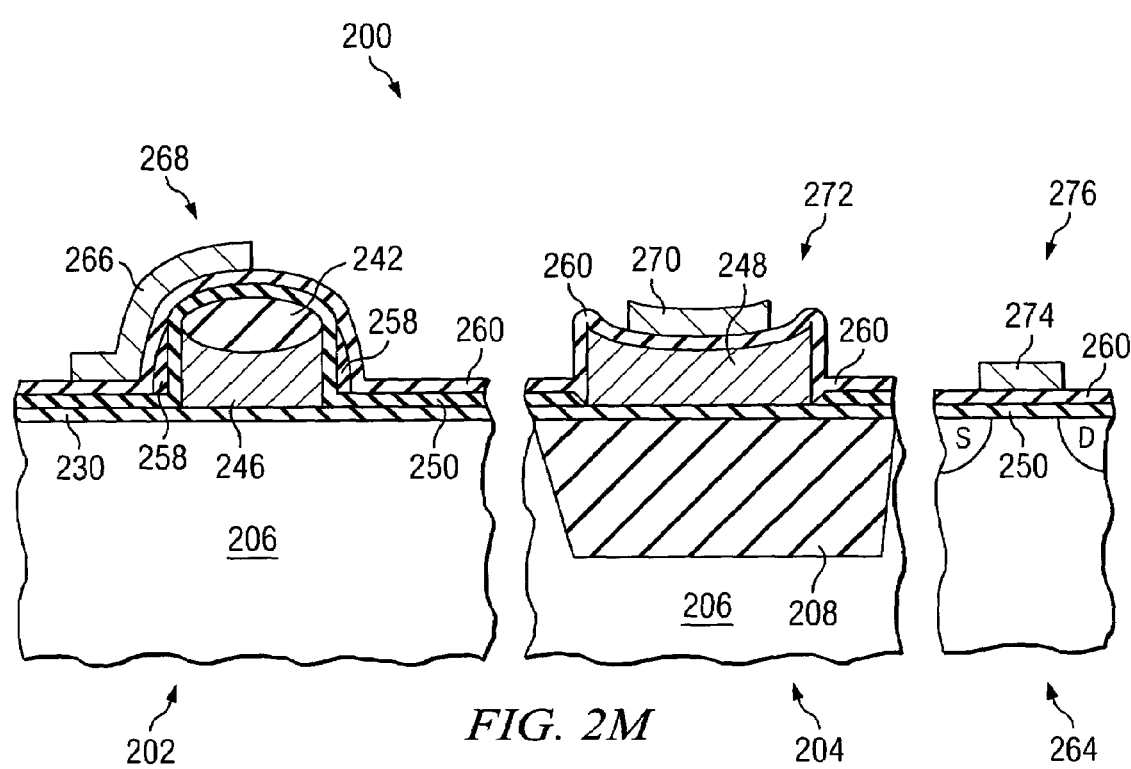

Next, the second semiconductor material layer 262 is patterned and etched, using a third photoresist layer (not shown). The second semiconductor material layer 262 in the transistor region 202 forms a control gate 266, as shown in FIG. 2M. Thus, a transistor 268 including gate oxide 230, floating gate 246, gate oxide 250, and control gate 266 is formed in the transistor region 202. The control gate 266 preferably comprises a split gate transistor such as a transistor used in a flash memory cell, for example, in one embodiment.

The second semiconductor material layer 262 in the capacitor region 204 comprises a second or top electrode 270. Thus, a PIP capacitor 272 comprising bottom electrode 248, capacitor dielectric 260 comprised of third oxide layer 260, and top electrode 270, is formed in the capacitor region 204.

Optionally, in one embodiment, the second semiconductor material layer 262 in a periphery circuit region 264 forms a transistor gate 274. Thus, a transistor 276 comprising a source S, drain D, gate oxide 250 and/or 260, and a gate 274 may be formed in the periphery circuit region 264 in accordance with an embodiment of the present invention.

Advantages of embodiments of the invention include providing a method of fabricating a mixed-mode PIP capacitor 272 (FIG. 2M) that has a reduced number of lithography masks. The bottom electrode 248 of a PIP capacitor 272 and a floating gate 246 of a split gate transistor 268 are formed from a single first layer of semiconductor material 232 (see FIGS. 2D and 2E), using only one mask to pattern the first semiconductor material layer 232. The capacitor dielectric 260 of the PIP capacitor 272 and a portion of the gate oxide 260 (see FIG. 2L) of the split gate transistor 268 may be formed from the same oxide layer. The top electrode 270 of the PIP capacitor 272 and the control gate 266 of the split gate transistor 268 are formed from a single second layer of semiconductor material 262 (see FIG. 2L), using a single mask to pattern the semiconductor material second layer 262. The PIP capacitor manufacturing process is fully compatible with the lithography and patterning processes for a split gate transistor. Advantageously, the PIP capacitor dielectric 260 is thin and does not include a poly-oxide material region, which increases the capacitance of the PIP capacitor 272. In one embodiment, the nitride layer 252 that is used as a hard mask to remove poly-oxide region 244 and oxide layer 250 from over the PIP capacitor 272 bottom electrode 248 may form a spacer 258 on sidewalls of the floating gate 246 of the split gate transistor device 268, preventing reverse tunneling of the split gate transistor device 268.

Embodiments of the present invention have useful application in flash memory devices, other non-volatile memory (NVM) applications, mixed-signal/radio frequency (RF) applications, and embedded semiconductor devices, as examples. The methods of forming a PIP capacitor described herein are particularly useful in system-on-a-chip (SOC) applications for mobile phone IC's or other multi-function IC's for specific device applications, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a capacitor, the method comprising:

providing a workpiece, the workpiece including at least one capacitor region and at least one transistor region;

depositing a first semiconductor layer over the workpiece;

forming a hard mask layer over the first semiconductor layer;

patterning the hard mask layer with a pattern for at least one bottom electrode in the at least one capacitor region and a pattern for at least one floating gate in the at least one transistor region;

forming a first poly-oxide region over the pattern for each at least one floating gate and forming a second poly-oxide region over the pattern for each at least one bottom electrode, the first poly-oxide region having a first top surface and the second poly-oxide region having a second top surface;

removing the hard mask layer, leaving portions of the first semiconductor layer exposed;

removing the exposed portions of the first semiconductor layer to form the at least one floating gate in the at least one transistor region and the at least one bottom electrode in the at least one capacitor region, the at least one floating gate having first sidewalls and the at least one bottom electrode having second sidewalls;

forming a first oxide layer over the first top surface of the first poly-oxide region, the second top surface of the second poly-oxide region, the second sidewalls of the at least one bottom electrode, and the first sidewalls of the at least one floating gate;

removing the first oxide layer and the second poly-oxide region in the at least one capacitor region;

forming a second oxide layer over at least the at least one capacitor bottom electrode in the capacitor region;

depositing a second semiconductor layer over the second oxide layer; and removing portions of the second semiconductor layer to form a control gate proximate each at least one floating gate in the at least one transistor region and a top electrode over each bottom electrode in the at least one capacitor region.

2. The method according to claim 1, wherein removing the first oxide layer and the second poly-oxide region in the at least one capacitor region comprises:

depositing a nitride layer over the first oxide layer;

removing a portion of the nitride layer to expose at least a portion of the at least one bottom electrode in the capacitor region;

removing the first oxide layer and the second poly-oxide region from over a top surface of the bottom electrode; and removing at least portions of the nitride layer.

3. The method according to claim 2, wherein removing the first oxide layer and the second poly-oxide region further comprises removing the first oxide layer from the second sidewalls of the bottom electrode.

4. The method according to claim 2, wherein removing the first oxide layer and the second poly-oxide region comprises a wet dip etch process.

5. The method according to claim 2, wherein forming the hard mask layer and depositing the nitride layer comprise depositing silicon nitride.

6. The method according to claim 2, wherein removing at least portions of the nitride layer comprises leaving a spacer comprising the nitride layer on the first sidewalls of the at least one floating gate.

7. The method according to claim 6, wherein removing at least portions of the nitride layer comprises an anisotropic etch process.

8. The method according to claim 1, wherein depositing the first semiconductor layer and the second semiconductor layer comprise depositing polysilicon.

9. The method according to claim 1, wherein forming the first oxide layer and the second oxide layer comprise forming silicon dioxide.

10. The method according to claim 1, wherein patterning the hard mask layer comprises depositing a first photoresist layer over the hard mask layer, patterning the first photoresist layer, and using the first photoresist layer to pattern the hard mask layer, and wherein removing portions of the second semiconductor layer comprises depositing a second photoresist layer over the second semiconductor layer, patterning the second photoresist layer, and using the second photoresist layer to pattern the second semiconductor layer.

11. The method according to claim 1, wherein removing the exposed portions of the first semiconductor layer comprises using the first poly-oxide region and the second poly-oxide region as a mask to pattern the first semiconductor layer.

12. The method according to claim 1, wherein the workpiece includes at least one periphery circuit region, wherein removing the portions of the second semiconductor layer further comprises forming at least one gate of a transistor in the at least one periphery circuit region.

13. The method according to claim 1, wherein forming the at least one floating gate in the at least one transistor region and forming the at least one bottom electrode in the at least one capacitor region comprise using a single lithography mask to pattern the first semiconductor layer.

14. The method according to claim 1, wherein forming the control gate in the at least one transistor region and forming the top electrode over each bottom electrode in the at least one capacitor region comprise using a single lithography mask to pattern the second semiconductor layer.

15. The method according to claim 1, wherein forming the first poly-oxide region and forming the second poly-oxide region comprise a wet oxidation process.

16. The method according to claim 1, wherein the method includes forming a split gate transistor in the at least one transistor region, the split gate transistor comprising the floating gate, a gate oxide comprised of the first oxide layer, and the control gate, and wherein the method includes forming a polysilicon-insulator-polysilicon (PIP) capacitor in the at least one capacitor region, the PIP capacitor comprising the bottom electrode, a capacitor dielectric comprising the second oxide layer, and the top electrode.

17. The method according to claim 16, wherein forming the split gate transistor comprises forming a flash memory device.

18. The method according to claim 16, further comprising forming a third oxide layer over the workpiece, before depositing the first semiconductor layer, wherein the third oxide layer comprises a tunnel oxide in at least the transistor region.

19. The method according to claim 18, wherein forming the third oxide layer comprises a thermal oxidation process.

20. A method of forming a polysilicon-insulator-polysilicon (PIP) capacitor, the method comprising:
providing a workpiece, the workpiece including at least one capacitor region and at least one transistor region;
forming a first oxide layer over the workpiece;
depositing a first polysilicon layer over the first oxide layer;
forming a mask layer over the first polysilicon layer, the mask layer comprising a pattern for at least one bottom electrode in the at least one capacitor region and a pattern for at least one floating gate in the at least one transistor region;
forming a first poly-oxide region over the pattern for each at least one floating gate and forming a second poly-oxide region over the pattern for each at least one bottom electrode, the first poly-oxide region having a first top surface and the second poly-oxide region having a second top surface;
removing the mask layer, leaving portions of the first polysilicon layer exposed;
using the first poly-oxide region and the second poly-oxide region as a mask to remove the exposed portions of the first polysilicon layer and form at least one floating gate in the at least one transistor region and the at least one bottom electrode in the at least one capacitor region, the at least one floating gate having first sidewalls and the at least one bottom electrode having second sidewalls;
forming a second oxide layer over the top surface of the first poly-oxide region, the second top surface of the second poly-oxide region, the second sidewalls of the at least one bottom electrode, the first sidewalls of the at least one floating gate, and the first oxide layer;
depositing a second nitride layer over the second oxide layer;
removing a portion of the second nitride layer to expose at least a portion of the second poly-oxide region over the bottom electrode in the capacitor region;
removing the second oxide layer and the second poly-oxide region from over a top surface of the bottom electrode in the at least one capacitor region;
removing at least portions of the second nitride layer, leaving a spacer comprising the second nitride layer on the sidewalls of the at least one floating gate;
forming a third oxide layer over at least the at least one capacitor bottom electrode in the capacitor region;
depositing a second polysilicon layer over the third oxide layer;
depositing a second photoresist layer over the second polysilicon layer;
patterning the second photoresist layer; and
using the second photoresist layer to pattern the second polysilicon layer, forming a control gate proximate each at least one floating gate in the at least one transistor region, and forming a top electrode over each bottom electrode in the at least one capacitor region, wherein the bottom electrode, the top electrode, and the third oxide layer disposed between the bottom electrode and top electrode comprise a PIP capacitor.

21. The method according to claim 20, wherein removing the second oxide layer and the second poly-oxide region further comprises removing the second oxide from the second sidewalls of the bottom electrode.

22. The method according to claim 20, wherein removing the second oxide layer and the second poly-oxide region comprises a wet dip etch process.

23. The method according to claim 20, wherein forming the first oxide layer, the second oxide layer and the third oxide layer comprise forming silicon dioxide.

24. The method according to claim 23, wherein forming the first oxide layer comprises a thermal oxidation process.

25. The method according to claim 20, wherein the workpiece includes at least one periphery circuit region, wherein patterning the second polysilicon layer further comprises forming at least one gate of a transistor in the at least one periphery circuit region.

26. The method according to claim 20, wherein forming the first poly-oxide region and forming the second poly-oxide region comprise a wet oxidation process.

27. The method according to claim 20, wherein the method includes forming a split gate transistor in the at least one transistor region, the split gate transistor comprising the floating gate, a gate oxide comprised of the second oxide layer, and the control gate.

28. The method according to claim 27, wherein forming the split gate transistor comprises forming a flash memory device.

29. The method according to claim 20, wherein the first oxide layer comprises a tunnel oxide in at least the transistor region.

* * * * *

UNITED STATES PATENT AND TRADEMARK OFFICE
CERTIFICATE OF CORRECTION

PATENT NO. : 7,029,968 B2  Page 1 of 1
APPLICATION NO. : 10/729084
DATED : April 18, 2006
INVENTOR(S) : Tu It is certified that error appears in the above-identified patent and that said Letters Patent is hereby corrected as shown below:

Column 12, line 34; delete "the top" insert --the first top--

Signed and Sealed this

Twenty-first Day of November, 2006

JON W. DUDAS
*Director of the United States Patent and Trademark Office*